United States Patent
Chang

(10) Patent No.: US 8,163,655 B2
(45) Date of Patent: Apr. 24, 2012

(54) METHOD FOR FORMING A SACRIFICIAL SANDWICH STRUCTURE

(75) Inventor: Ching-Yu Chang, Yilang County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 47 days.

(21) Appl. No.: 12/560,164

(22) Filed: Sep. 15, 2009

(65) Prior Publication Data

US 2010/0068874 A1    Mar. 18, 2010

Related U.S. Application Data

(60) Provisional application No. 61/097,014, filed on Sep. 15, 2008.

(51) Int. Cl.
*H01L 21/302* (2006.01)

(52) U.S. Cl. .......... 438/751; 438/745; 257/E21.219

(58) Field of Classification Search .......... 438/745, 438/749, 750, 751
See application file for complete search history.

(56) References Cited

U.S. PATENT DOCUMENTS

| | | | | |
|---|---|---|---|---|
| 3,681,134 A | * | 8/1972 | Nathanson et al. | 438/622 |
| 4,495,026 A | * | 1/1985 | Herberg | 438/652 |
| 4,638,347 A | * | 1/1987 | Iyer | 257/386 |
| 5,326,429 A | * | 7/1994 | Cohen et al. | 216/22 |
| 7,416,681 B2 | * | 8/2008 | Kim et al. | 252/79.1 |
| 2007/0052099 A1 | * | 3/2007 | Carroll et al. | 257/751 |
| 2008/0045035 A1 | * | 2/2008 | Lee et al. | 438/754 |

FOREIGN PATENT DOCUMENTS

| | | |
|---|---|---|
| CN | 1892994 | 1/2007 |
| CN | 101013672 | 8/2007 |
| CN | 101027770 | 8/2007 |

OTHER PUBLICATIONS

Chinese Patent Office, Office Action dated Jan. 18, 2011; Application No. 200910173527.3; 6 pages.

* cited by examiner

*Primary Examiner* — Charles Garber
*Assistant Examiner* — Reema Patel
(74) *Attorney, Agent, or Firm* — Haynes and Boone, LLP

(57) ABSTRACT

The present disclosure provides a method for making a semiconductor device. The method includes forming a first material layer on a substrate; forming a second material layer on the first material layer; forming a sacrificial layer on the second material layer; forming a patterned resist layer on the sacrificial layer; applying a first wet etching process using a first etch solution to the substrate to pattern the sacrificial layer using the patterned resist layer as a mask, resulting in a patterned sacrificial layer; applying an ammonia hydroxide-hydrogen peroxide-water mixture (APM) solution to the substrate to pattern the second material layer, resulting in a patterned second material layer; applying a second wet etching process using a second etch solution to the substrate to pattern the first material layer; and applying a third wet etching process using a third etch solution to remove the patterned sacrificial layer.

21 Claims, 2 Drawing Sheets

METHOD FOR FORMING A SACRIFICIAL SANDWICH STRUCTURE

PRIORITY DATA

This application claims priority to Provisional Application Ser. No. 61/097,014 filed on Sep. 15, 2008, entitled "Method for Forming a Sacrificial Sandwich Structure," the entire disclosure of which is incorporated herein by reference.

BACKGROUND

In advanced technology nodes of semiconductor industry, metal and high k dielectric material are used to form a metal gate stack of a field-effect transistor (FET). When forming the metal gate stack, one or more metal layers are patterned including deposition and etching. During the metal etch, the etch processing window is not enough and the photoresist (resist) may experience a peeling issue at the metal etch step. Particularly, the usual dry etch process is challenging since the material to be etched is very thin and weak. The exposed metal film cannot be completely etched away and the patterned resist cannot be removed by solvent strip after the dry etch. The substrate also shows damage after the dry etch process. For an usual wet etch process, the wet etch solution can penetrate into the interface between the patterned resist and the metal film and oxidize the metal film underlying the patterned resist, therefore further changing the metal film and degrading the device performance. Moreover, the patterned resist may peel away from the underlying metal film during the wet etch process.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

DETAILED DESCRIPTION

Figure 1:
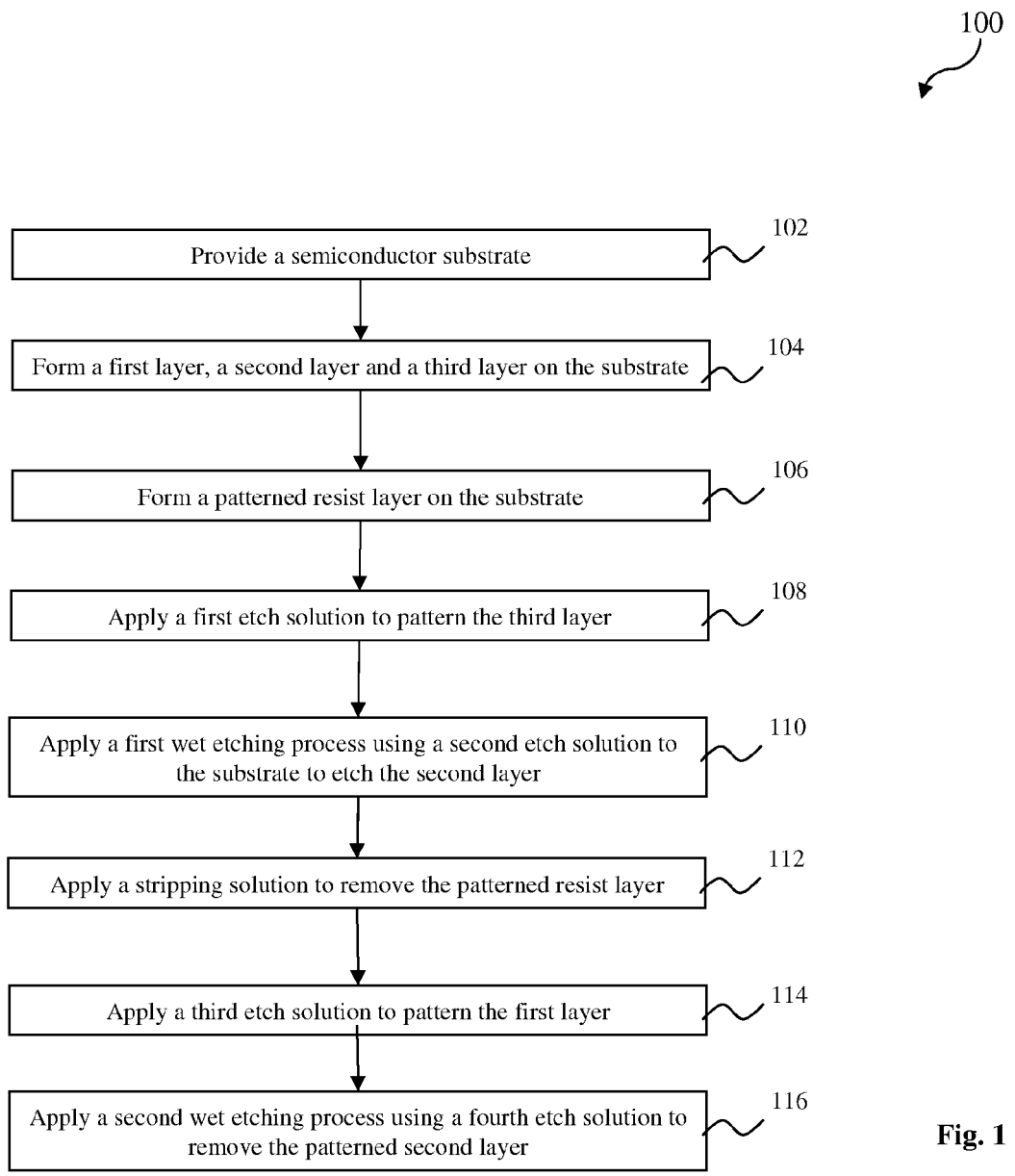
FIG. 1 is a flowchart of a method making a semiconductor device in one embodiment constructed according to aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIG. 1 is a flowchart of one embodiment of a method 100 making a semiconductor device having a metal gate stack constructed according to aspects of the present disclosure. FIGS. 2 through 8 are sectional views of one embodiment of a semiconductor structure 200 at various fabrication stages. The method 100 of making a semiconductor device is described with reference to FIGS. 1 through 8.

Figure 2:
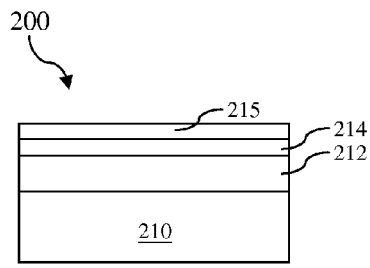
FIGS. 2 through 8 are sectional views of one embodiment of a semiconductor structure having a metal gate stack at various fabrication stages constructed according to aspects of the present disclosure.

Referring to FIGS. 1 and 2, the method 100 begins at step 102 by providing a semiconductor substrate 210. The semiconductor substrate 210 includes silicon. Alternatively, the substrate 210 includes germanium, silicon germanium or other suitable semiconductor material, such as diamond, silicon carbide or gallium arsenic. The substrate 210 may further include additional features and/or material layers, such as various isolation features formed in the substrate. The substrate 210 may include various p-type doped regions and/or n-type doped regions configured and coupled to form various devices and functional features. All doping features may be achieved using a suitable process, such as ion implantation in various steps and techniques. The substrate 210 may include other features, such as a shallow trench isolation (STI).

The substrate 210 may further include various dielectric-metal-gate-stack material layers. In one embodiment, a high k dielectric material layer is formed on the semiconductor substrate 210. The high k dielectric material layer is formed by a suitable process such as an atomic layer deposition (ALD). Other methods to form the high k dielectric material layer include metal organic chemical vapor deposition (MOCVD), physical vapor deposition (PVD), UV-Ozone Oxidation and molecular beam epitaxy (MBE). In one embodiment, the high k dielectric material includes HfO2. Alternatively, the high k dielectric material layer includes metal nitrides, metal silicates or other metal oxides.

A capping layer may be further formed on the high k dielectric material layer. In one embodiment, the capping layer includes lanthanum oxide (LaO). In another embodiment, the capping layer includes aluminum oxide (Al2O3). In another embodiment, the capping layer includes titanium nitride (TiN). The capping layer may alternatively includes other suitable material.

An interfacial layer (IL) may be interposed between the semiconductor substrate 210 and the high k dielectric material layer. The interfacial layer may include a thin silicon oxide layer and is formed on the silicon substrate 210 before forming the high k dielectric material layer. The thin silicon oxide layer may be formed by atomic layer deposition (ALD) or thermal oxidation.

Still referring to FIGS. 1 and 2, the method 100 proceeds to step 104 by forming a first layer of a first material 212 on the substrate 210, a second layer of a second material (or sacrificial layer) 214 on the first layer 212, and a third layer 215 of a third material on the second layer 214. The first material includes a metal. In one embodiment, the first material includes titanium nitride (TiN). Alternatively, the first material includes lanthanum oxide (LaO), tantalum nitride (TaN), molybdenum nitride (MoN), tungsten nitride (WN), tantalum carbide (TaC), tantalum carbide nitride (TaCN), titanium aluminum nitride (TiAlN), aluminum (Al), aluminum oxide (AlO), or tungsten (W). The first, second and third layers each is formed by physical vapor deposition (PVD), atomic layer deposition (ALD) or other suitable method. The third layer 215 is a sacrificial material layer that is implemented during the disclosed process to pattern the first and second layers and is removed thereafter. The second material includes titanium nitride (TiN) or lanthanum oxide (LaO). The second layer may be formed by PVD or other suitable method. The third layer material include lanthanum oxide (LaO), silicon oxide (SiO), silicon, or aluminum oxide (AlO). In one embodiment, the first, second and third layers each has a thickness less than about 100 angstrom. In another embodiment, the first, second and third layers each has a thickness between about 5 angstrom and about 500 angstrom. In one example, the first layer has a thickness of about 10 angstrom. In another example, the second layer has a thickness ranging between about 20 angstrom and about 90 angstrom. In another example, the third layer has a thickness ranging between about 8 angstrom and about 200 angstrom.

Figure 3:
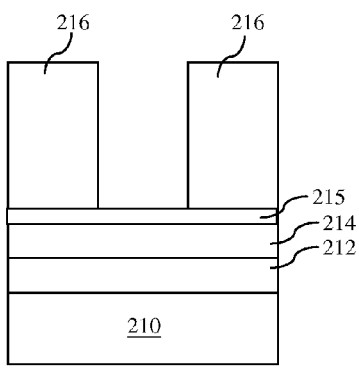

Referring to FIGS. 1 and 3, the method 100 proceeds to step 106 by forming a patterned photoresist layer 216 on the substrate 210. The patterned photoresist layer 216 is used as a mask to pattern the sandwich structure, including the first, second and third layers. Particularly, the patterned photoresist layer 216 is formed on the third layer as illustrated in FIG. 3. The patterned photoresist layer is formed by a photolithography process. An exemplary photolithography process may include processing steps of photoresist coating, soft baking, mask aligning, exposing, post-exposure baking, developing photoresist and hard baking. The lithography process may implement krypton fluoride (KrF) excimer lasers, argon fluoride (ArF) excimer lasers, ArF immersion lithography, extreme ultra-violet (EUV) or electron-beam writing (e-beam). The photolithography exposing process may also be implemented or replaced by other proper methods such as maskless photolithography, ion-beam writing, and molecular imprint. Additionally, a diluted ammonia hydroxide-hydrogen peroxide-water mixture ($NH_4OH/H_2O_2/H_2O$ or APM) solution is applied to the third layer and then a hexamethyl disilazane (HMDS) solution is applied to the third layer to enhance resist adhesion before the coating on the resist layer. As one example, the diluted APM solution has composition ratios ranging between about 1:1:2 and about 1:1:150 of $NH_4OH/H_2O_2/H_2O$. The diluted APM solution has a temperature ranging between about 20° C. and about 75° C. when applied to the third layer. In one embodiment, the patterned resist layer 216 defines various openings to expose the underlying sacrificial material layer. The patterned photoresist layer define various gate regions and the openings of the patterned resist layer defines the regions wherein the sandwich structure layers are to be removed.

Figure 4:
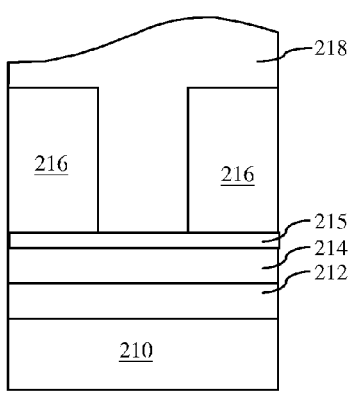

Referring to FIGS. 1 and 4, the method 100 may include an additional cleaning step after the formation of the patterned resist layer. At this step, a cleaning material 218 is applied to the patterned resist layer to clean organic residue or other residues. The cleaning material is capable of removing the organic residue. As one example, the cleaning material includes a top anti-reflective coating (TARC) layer. In this case, the TARC is coated on the substrate and is further baked and rinsed. Alternatively or additionally, the cleaning material includes solvent, surfactant or polymer ingredient. In another embodiment, the cleaning method includes UV-ozone treatment. The UV lamp contained 184.9 nm and 253.7 nm wavelength energy. In another embodiment, the cleaning method includes ozone water rinse. In another embodiment, the cleaning method includes ammonia peroxide mixture (APM) rinse.

Figure 5:
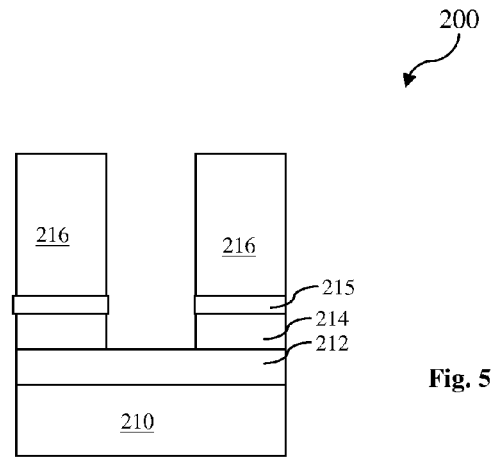

Referring to FIGS. 1 and 5, the method 100 proceeds to step 108 by applying a first etch solution to the semiconductor structure to pattern the third layer 215, using the patterned resist layer as an etch mask. In furtherance of the embodiment, the third layer 215 includes lanthanum oxide (LaO), silicon, oxide, aluminum oxide (AlO), titanium nitride (TiN). The etching duration ranges between about 5 seconds and about 5 minutes for the APM solution if the third layer is TiN, depending on the thickness of the third layer and the processing conditions. The etching solution may be HF solution if the third layer is oxide, and the HF concentration ranges from 1:5 to 1:1000 ($HF:H_2O$), the etch time ranges between 5 seconds and about 5 minutes. The temperature ranges from 20 to 50 degree C. In another embodiment, the etching solution may use TMAH (tetramethylammonia hydroxide) solution if the third layer is silicon. The etching duration ranges between 5 seconds to about 5 minutes. The TMAH concentration ranges from 1% to 30%. The etch temperature ranges from 20 to 50 degree C. If the third layer is lanthanum oxide (LaO), the etch solution may use hydrochloric (HCl) solution, the concentration may range from 1:5 to 1:1000 ($HCL: H_2O$). The etch time ranges from 3 seconds to 5 minutes. The temperature ranges from 20 to 50 degree C. In another embodiment, the etch solution may also use SC2 solution. The composition of SC2 is $HCl/H_2O_2/H_2O$. The concentration ranges from 1:1:5 to 1:1:500. The etch time ranges from 3 seconds to 5 minutes. The temperature ranges from 20 to 50 degree C. In another embodiment, the etch solution for lanthanum oxide may also use $CO_2$ water. The $CO_2$ water resistance is less than 15 mega ohm-cm. The $CO_2$ etch time ranges from 2 seconds to 5 minutes. The temperature ranges from 20 to 50 degree C. In another example, the first etch solution includes acetic acid solution, citric acid, boric acid or phosphoric acid. In another embodiment, the etch solution is a polymer solution. The polymer solution has pH value less than 7. For example, the polymer solution contains acid compound. The acid compound may include perfluorooctanesulfonic acid (PFOS). The PFOS concentration ranges from 0.1% to 5%. The etch temperature ranges from 20 to 130 degree C. The etch time is about 10 seconds to 5 minutes.

Still referring to FIGS. 1 and 5, the method 100 proceeds to step 110 by applying a first wet etching process using a second wet etching solution to the semiconductor structure to etch the second layer 214. The second layer within the openings of the patterned resist layer is removed by the second etch solution and the first layer 212 is exposed within the openings thereafter. In one embodiment, TiN is used as the second material of the second layer and the second etch solution utilizes ammonia peroxide mixture (APM) solution. For example, the second etch solution includes $NH_4OH$, $H_2O_2$ and water ($H_2O$). The $NH_4OH/H_2O_2/H_2O$ ratio may range from about 1:1:3 to about 1:1:1000. The etching duration may have a range between about 5 seconds and about 5 minute. In another embodiment, the second etch solution includes a weak acid. In another embodiment, the second layer of the second material includes $Al_2O_3$ and the second etch solution includes a resist developer. For example, a tetramethylammonium hydroxide (TMAH) solution is used to remove the $Al_2O_3$ sacrificial layer. In furtherance of the above embodiments, a wet etching solution having a pH value below 7 may be used to etch the LaO sacrificial material layer. A wet etching solution having a pH value below 9 may be used to etch the $Al_2O_3$ sacrificial material layer. In one embodiment, LaO is used as the second material of the second layer and the second etch solution utilizes HCl solution. For example, the second wet etching solution includes HCL and water (H2O). The HCl/H2O ratio may range from about 1:3 to about 1:1000. The etching duration may have a range between about 5 seconds and about 5 minutes.

Figure 6:
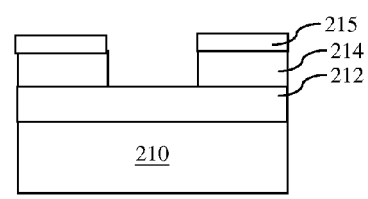

Referring to FIGS. 1 and 6, the method 100 proceeds to step 112 by applying a stripping solution to remove the patterned resist layer 216. Instead of using a plasma ashing, a stripping solution is used in this method. In various embodiments, the stripping solution includes N-methyl-2-pyrrolidine (NMP), cyclohexanol, cyclopentanol, propylene glycol monomethyl ether (PGME) or Propylene glycol monomethyl ether acetate (PGMEA). Alternatively, the step 112 to remove the patterned resist layer by the stripping solution can be performed between the step 108 to apply the first wet etch solution to pattern the third layer and the step 110 to apply the second wet etching process to pattern the second layer. In this case, the patterned third layer is used as a mask to pattern the second layer.

Figure 7:
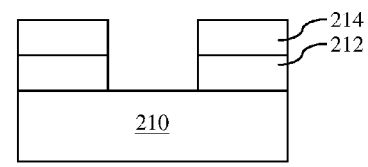

Referring to FIGS. 1 and 7, the method 100 proceeds to step 114 using a third etch solution to pattern the first layer 212. If the first layer and third layer 215 are the same material, the third and first layer can be removed simultaneously during the third wet etch process. In one embodiment, the etching duration may have a range between about 5 seconds and about 5 minute.

Figure 8:
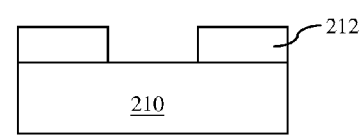

Referring to FIGS. 1 and 8, the method 100 proceeds to step 116 by applying a second wet etching process using a fourth etch solution to remove the patterned second layer 214. The fourth etch solution used in the second wet etching process is different from the first etch solution used at step 108 to pattern the third layer. In one embodiment, the patterned second layer includes TiN and the fourth etch solution includes ammonia peroxide mixture (APM). In this example, the third layer includes LaO. For example, the first etch solution to the third layer includes HCl and water (H2O). The HCl/H2O ratio may range from about 1:1 to about 1:1000. The etching duration may have a range between about 5 seconds and about 5 minute. In another embodiment, the first wet etching solution includes a weak acid. In one example, the weak acid solution include carbon oxide (CO2) water. In another example, the first etch solution includes acetic acid solution, citric acid, boric acid or phosphoric acid. In another embodiment, the patterned sacrificial material layer (the third layer) includes Al2O3 and the first etch solution includes a resist developer or base solution. For example, a tetramethylammonium hydroxide (TMAH) solution is used to remove the sacrificial material (the third layer).

Various advantages may be present in various applications of the disclosed method. As one example, by using the disclosed sandwich structure, the APM etch to the second layer and the wet etching process to the first layer do not necessarily use photoresist as a wet etch hard mask. Therefore, the etch time can be longer without the resist peeling issue. The third layer (oxide base material like lanthanum oxide) has high wet etch selectivity to the second layer with tuned chemical formulation. Therefore, the third layer does not necessarily use a thicker LaO layer. The etch during for third layer patterning can be reduced and the resist peeling issue is eliminated accordingly. The residue issue of the second layer is also eliminated as the wet etching process to the second layer can use the third layer as an etching mask. It is expected to have a clear patterned first layer through the second layer and third layer as an etch mask without resist adhesion and peeling issue. In another embodiment, the third material layer includes metal oxide and can also be used as a stop layer to eliminate H2O2 oxidation to the first metal layer. In another embodiment, when the second and third layers are formed on the first material layer, the first layer will have a good lateral etch control. It is understood that no particular advantage is necessarily required for all embodiments disclosed herein.

Although not shown, other processing step may present to form various doped regions such as source and drain regions, devices features such as multilayer interconnection (MLI). In one example, the first material layer may alternatively include other material layer to be patterned. For example, the first material layer includes high k dielectric material layer, such as lanthanum oxide or aluminum oxide. In another example, the second material layer can include other suitable metal oxide to be implemented in this wet etch process flow to pattern metal gate stack. In another example, the third material layer can be sacrificial layer with reduced or eliminated resist peeling issue.

In another example, additional patterning steps may be applied to the substrate to further pattern the metal gate stack. In another example, the light doped drain (LDD) regions are formed after the formation of the gate stack. A gate spacer may be formed on the sidewalls of the metal gate stack. Then the source and drain regions are formed substantially aligned with the outer edges of the spacers. The gate spacers may have a multilayer structure and may include silicon oxide, silicon nitride, silicon oxynitride, or other dielectric material. The doped source and drain regions and LDD regions of either an n-type dopant or a p-type dopant are formed by a conventional doping process such as ion implantation. N-type dopant impurities employed to form the associated doped regions may include phosphorus, arsenic, and/or other materials. P-type dopant impurities may include boron, indium, and/or other materials.

The multilayer interconnection are further formed. The multilayer interconnection includes vertical interconnects, such as conventional vias or contacts, and horizontal interconnects, such as metal lines. The various interconnection features may implement various conductive materials including copper, tungsten and silicide. In one example, a damascene process is used to form copper related multilayer interconnection structure. In another embodiment, tungsten is used to form tungsten plug in the contact holes.

The semiconductor substrate may further include additional isolation features to isolate each from other devices. The isolation features may include different structures and can be formed using different processing technologies. For example, an isolation feature may include shallow trench isolation (STI) features. The formation of STI may include etching a trench in a substrate and filling the trench by insulator materials such as silicon oxide, silicon nitride, or silicon oxynitride. The filled trench may have a multi-layer structure such as a thermal oxide liner layer with silicon nitride filling the trench. In one embodiment, the STI structure may be created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical planarization (CMP) to etch back, and using nitride stripping to leave the STI structure.

The present disclosure is not limited to applications in which the semiconductor structure includes a MOS transistor, and may be extended to other integrated circuit having a metal gate stack. For example, the semiconductor structure 200 may include a dynamic random access memory (DRAM) cell, a single electron transistor (SET), and/or other microelectronic devices (collectively referred to herein as microelectronic devices). In another embodiment, the semiconductor structure 150 includes FinFET transistors. Of course, aspects of the present disclosure are also applicable and/or readily adaptable to other type of transistor, including single-gate transistors, multiple-gate transistors, strained semiconductor substrate, a hetero-semiconductor device, and may be employed in many different applications, including sensor cells, memory cells, logic cells, and others.

Although embodiments of the present disclosure have been described in detail, those skilled in the art should understand that they may make various changes, substitutions and alterations herein without departing from the spirit and scope of the present disclosure. In one example, the second material layer may include tungsten oxide. In one embodiment, the disclosed method is used to form one or more metal-oxide-semiconductor field-effect-transistors (MOSFETs). In another embodiment, the disclosed method is used to form a metal gate stack in a gate-first process in which the metal gate stack is formed by the disclosed method and remains in the final structure. In another embodiment, the disclosed method is used to form a metal gate stack in a hybrid process in which the first type metal gate stack (such as NMOS metal gate stack) is formed by the disclosed method and remains in the final structure. The second type of the metal gate stack (such as PMOS metal gate stack) is formed as a dummy gate structure so that source/drain ion implantation processes and annealing processes can be implemented. Thereafter, a portion of the dummy gate stack is removed and the dummy gate trench is refilled with proper materials. In another embodiment, the disclosed method is used to form a metal gate stack in a gate-last process in which a dummy metal gate stack is formed by the disclosed method and is then, after the formation of the source and drain features, replaced with final metal layer materials collectively or separately for NMOS and PMOS.

In another embodiment, the semiconductor substrate may include an epitaxial layer. For example, the substrate may have an epitaxial layer overlying a bulk semiconductor. Further, the substrate may be strained for performance enhancement. For example, the epitaxial layer may include a semiconductor material different from those of the bulk semiconductor such as a layer of silicon germanium overlying a bulk silicon, or a layer of silicon overlying a bulk silicon germanium formed by a process including SEG. Furthermore, the substrate may include a semiconductor-on-insulator (SOI) structure such as a buried dielectric layer.

Thus, the present disclosure provides a method for making a semiconductor device. The method includes forming a first material layer on a substrate; forming a second material layer on the first material layer; forming a sacrificial layer on the second material layer; forming a patterned resist layer on the sacrificial layer; applying a first wet etching process using a first etch solution to the substrate to pattern the sacrificial layer using the patterned resist layer as a mask, resulting in a patterned sacrificial layer; applying an ammonia hydroxide-hydrogen peroxide-water mixture (APM) solution to the substrate to pattern the second material layer, resulting in a patterned second material layer; applying a second wet etching process using a second etch solution to the substrate to pattern the first material layer; and applying a third wet etching process using a third etch solution to remove the patterned sacrificial layer.

The disclosed method may further include applying a wet chemical to the substrate to remove the patterned photoresist layer after the applying the first etch solution and before the applying the APM solution. In another embodiment, the applying the wet chemical to the substrate is implemented before the applying the second etch solution. In various embodiments, the second material layer may include titanium nitride (TiN). The sacrificial layer may include lanthanum oxide (LaO). The first and third etch solutions each may include hydrochloric acid (HCl). In another embodiment, the first and third etch solution each may include carbon oxide (CO2) water. The sacrificial layer may include aluminum oxide (Al2O3). The first etch solution may include a tetramethylammonium hydroxide (TMAH) solution. The first wet etching process may include applying a weak acid solution to the substrate, the weak acid solution is selected from the group consisting of CO2 water, acetic acid solution, citric acid, boric acid, and phosphoric acid. The method may further include applying a cleaning material to the patterned photoresist layer before the applying the first etch process.

The present disclosure also provides another embodiment of a method for making a semiconductor device. The method includes forming a lanthanum oxide (LaO) layer on a substrate; forming a titanium nitride (TiN) layer on the LaO layer; forming a sacrificial layer on the TiN layer, resulting in a sandwich structure; forming a patterned photoresist layer on the sacrificial layer; applying a first wet etching process to the substrate to pattern the sacrificial layer, using the patterned photoresist layer as a mask; applying a second wet etching process to the substrate to pattern the TiN layer; applying a third wet etching process to the substrate to pattern the LaO layer; and applying a fourth wet etching process to remove the sacrificial layer.

The disclosed method may further include applying a wet chemical to the substrate to remove the patterned photoresist layer after the applying the first etching process and before the applying the second wet etching process. In one embodiment, the wet chemical is selected from the group consisting of N-methyl-2-pyrrolidine (NMP), cyclohexanol, cyclopentanol, propylene glycol monomethyl ether (PGME), and Propylene glycol monomethyl ether acetate (PGMEA). The method may further include removing the patterned photoresist layer after the applying the first wet etching process and before the applying the second wet etching process. The third wet etching processes may include an etchant having hydrochloric acid (HCl) and water (H2O).

The present disclosure also provides another embodiment of a method for making a semiconductor device. The method includes forming a first layer of a first material on a substrate; forming a second layer of a second material on the first layer; forming a third layer of a third material on the second layer; forming a patterned photoresist layer on the third layer; applying a first wet etching process with an etchant to the substrate to pattern the third layer, using the patterned photoresist layer as a mask; applying a second wet etching process to the substrate to pattern the second layer; applying a third wet etching process to the substrate to pattern the first layer; and applying a fourth wet etching process with the etchant to remove the third layer.

In various embodiments, the first material may include lanthanum oxide (LaO). The first material may include a material selected from the group consisting of MoN, TaC, WN, TiAlN, TaN, TaCN, AlO, TiN, W and Al. The applying the third wet etching process may include patterning the first layer to form a metal gate of a field-effect transistor (FET). The second material may include titanium nitride (TiN). The first wet etching process may include applying a chemical solution having a pH value less than about 7. The etchant may include hydrochloric acid (HCl) and water (H2O). The third material may include aluminum oxide (Al2O3). The etchant may include a tetramethylammonium hydroxide (TMAH) solution.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method for making a semiconductor device comprising:
    forming a first material layer on a substrate;
    forming a second material layer on the first material layer;
    forming a sacrificial layer on the second material layer, wherein the sacrificial layer comprises lanthanum oxide (LaO);
    forming a patterned resist layer on the sacrificial layer;
    applying a first wet etching process using a first etch solution to the substrate to pattern the sacrificial layer using the patterned resist layer as a mask, resulting in a patterned sacrificial layer;
    applying an ammonia hydroxide-hydrogen peroxide-water mixture (APM) solution to the substrate to pattern the second material layer, resulting in a patterned second material layer;
    applying a second wet etching process using a second etch solution to the substrate to pattern the first material layer; and
    applying a third wet etching process using a third etch solution to remove the patterned sacrificial layer.

2. The method of claim 1, further comprising applying a wet chemical to the substrate to remove the patterned photoresist layer after the applying the first etch solution and before the applying the APM solution.

3. The method of claim 2, wherein the applying the wet chemical to the substrate is implemented before the applying the second etch solution.

4. The method of claim 1, wherein the second material layer comprises titanium nitride (TiN).

5. The method of claim 1, wherein the first and third etch solutions each comprises hydrochloric acid (HCl).

6. The method of claim 1, wherein the first and third etch solution each comprises carbon oxide (CO2) water.

7. The method of claim 1, wherein the first wet etching process comprises applying a weak acid solution to the substrate, the weak acid solution is selected from the group consisting of CO2 water, acetic acid solution, citric acid, boric acid, and phosphoric acid.

8. The method of claim 1, further comprising applying a cleaning material to the patterned photoresist layer before the applying the first etch process.

9. The method of claim 1, further comprising thereafter entirely removing the patterned second material layer.

10. A method for making a semiconductor device comprising:
    forming a lanthanum oxide (LaO) layer on a substrate;
    forming a titanium nitride (TiN) layer on the LaO layer;
    forming a sacrificial layer on the TiN layer, resulting in a sandwich structure;
    forming a patterned photoresist layer on the sacrificial layer;
    applying a first wet etching process to the substrate to pattern the sacrificial layer, using the patterned photoresist layer as a mask;
    applying a second wet etching process to the substrate to pattern the TiN layer;
    applying a third wet etching process to the substrate to pattern the LaO layer; and
    applying a fourth wet etching process to remove the sacrificial layer.

11. The method of claim 10, further comprising applying a wet chemical to the substrate to remove the patterned photoresist layer after the applying the first etching process and before the applying the second wet etching process.

12. The method of claim 11, wherein the wet chemical is selected from the group consisting of N-methyl-2-pyrrolidine (NMP), cyclohexanol, cyclopentanol, propylene glycol monomethyl ether (PGME), and Propylene glycol monomethyl ether acetate (PGMEA).

13. The method of claim 10, further comprising removing the patterned photoresist layer after the applying the first wet etching process and before the applying the second wet etching process.

14. The method of claim 10, wherein the third wet etching processes comprises an etchant having hydrochloric acid (HCl) and water (H2O).

15. A method for making a semiconductor device comprising:
    forming a first layer of a first material on a substrate;
    forming a second layer of a second material on the first layer;
    forming a third layer of a third material on the second layer;
    forming a patterned photoresist layer on the third layer;
    applying a first wet etching process with an etchant to the substrate to pattern the third layer, using the patterned photoresist layer as a mask;
    applying a second wet etching process to the substrate to pattern the second layer;
    applying a third wet etching process to the substrate to pattern the first layer; and
    applying a fourth wet etching process with the etchant to remove the third layer,
    wherein the applying the third wet etching process comprises patterning the first layer to form a metal gate of a field-effect transistor (FET).

16. The method of claim 15, wherein the first material comprises lanthanum oxide (LaO).

17. The method of claim 15, wherein the first material comprises a material selected from the group consisting of MoN, TaC, WN, TiAlN, TaN, TaCN, AlO, TiN, W and Al.

18. The method of claim 15, wherein the second material comprises titanium nitride (TiN).

19. The method of claim 15, wherein the first wet etching process comprises applying a chemical solution having a pH value less than about 7.

20. The method of claim 15, wherein the etchant comprises hydrochloric acid (HCl) and water (H2O).

21. The method of claim 15, wherein the third material comprises aluminum oxide (Al2O3).

* * * * *